United States Patent
Nishiyama et al.

(10) Patent No.: US 7,728,439 B2
(45) Date of Patent: Jun. 1, 2010

(54) SEMICONDUCTOR DEVICE, WIRING SUBSTRATE, AND METHOD FOR MANUFACTURING WIRING SUBSTRATE

(75) Inventors: Tomohiro Nishiyama, Tokyo (JP); Masamoto Tago, Tokyo (JP)

(73) Assignee: NEC Corporation, Tokyo (JP)

( * ) Notice: Subject to any disclaimer, the term of this patent is extended or adjusted under 35 U.S.C. 154(b) by 646 days.

(21) Appl. No.: 10/536,025

(22) PCT Filed: Nov. 21, 2003

(86) PCT No.: PCT/JP03/14917

§ 371 (c)(1),
(2), (4) Date: May 23, 2005

(87) PCT Pub. No.: WO2004/047167

PCT Pub. Date: Jun. 3, 2004

(65) Prior Publication Data

US 2006/0151870 A1   Jul. 13, 2006

(30) Foreign Application Priority Data

Nov. 21, 2002   (JP)   .............................. 2002-337376

(51) Int. Cl.
*H01L 23/48* (2006.01)
*H01L 23/52* (2006.01)
*H01L 29/40* (2006.01)

(52) U.S. Cl. .............................. 257/778; 257/E21.503; 438/15; 438/108

(58) Field of Classification Search ................. 438/118, 438/15, 108; 257/778, 691, E21.503, E21.511
See application file for complete search history.

(56) References Cited

U.S. PATENT DOCUMENTS 5,525,834 A * 6/1996 Fischer et al. ............... 257/691
5,919,329 A * 7/1999 Banks et al. ................. 156/281

(Continued)

FOREIGN PATENT DOCUMENTS

CN   1297253   5/2001

(Continued)

OTHER PUBLICATIONS

Japanese Patent Office issued a Japanese Office Action, Application No. 2004-553229.

*Primary Examiner*—Sue Purvis
*Assistant Examiner*—Monica D Harrison
(74) *Attorney, Agent, or Firm*—Young & Thompson

(57) ABSTRACT

The reliabilities of a wiring substrate and a semiconductor apparatus are improved by reducing the internal stress caused by the difference of thermal expansion coefficients between a base substrate and a semiconductor chip. A wiring layer (5) is provided on one surface of a silicon base (3). An electrode as the uppermost layer of the wiring layer (5) is provided with an external bonding bump (7). A through-electrode (4) is formed in the base (3) for electrically connecting the wiring layer (5) and an electrode terminal. The electrode terminal on the chip mounting surface is bonded to an electrode terminal of a semiconductor chip (1) by an internal bonding bump (6). The thermal expansion coefficient of the silicon base (3) is equivalent to that of the semiconductor chip (1) and not more than that of the wiring layer (5).

18 Claims, 21 Drawing Sheets

U.S. PATENT DOCUMENTS 6,107,689 A * 8/2000 Kozono ................ 257/778
6,316,289 B1 * 11/2001 Chung ................ 438/118

FOREIGN PATENT DOCUMENTS

| | | |
|---|---|---|
| JP | 8-64711 | 3/1996 |
| JP | 8-064711 | 3/1996 |
| JP | 8-330506 | 12/1996 |
| JP | 10-209216 | 8/1998 |
| JP | 2001-177010 | 6/2001 |

* cited by examiner

SEMICONDUCTOR DEVICE, WIRING SUBSTRATE, AND METHOD FOR MANUFACTURING WIRING SUBSTRATE

FIELD OF THE INVENTION

The present invention relates to a semiconductor apparatus, a wiring substrate for the semiconductor apparatus and a method for manufacturing the wiring substrate, and, more particularly to a Flip-Chip type semiconductor apparatus which is a face-down type, the wiring substrate for the Flip-Chip type semiconductor apparatus and a manufacturing method for the wiring substrate.

BACKGROUND OF THE INVENTION

All of patents, patent applications, patent publications, scientific articles and the like, which will hereinafter be cited or identified in the present application, will hereby be incorporated by references in their entirety in order to describe more fully the state of the art, to which the present invention pertains.

Recently, for improving mounting density of a semiconductor package, shrinkage, miniaturization, and pin-multiplication of the package has been progressed. Aligning electrode terminal in the area is an effective technology against the shrinkage and pin-multiplication, while maintaining a wide pitch between electrode terminals. In the second mounting for bonding the semiconductor package and a motherboard, this technology means a Ball Grid Array type of semiconductor packaging technology which bonds the electrode to the motherboard with solder bumps arranged on an interposer substrate. On the other hand, in the first mounting for bonding a semiconductor chip and the interposer substrate, this means a Flip-Chip bonding technology for bonding the both by area aligning, for example, the solder bumps or gold bumps on a functional surface of the semiconductor chip.

FIG. 1 is a cross sectional view showing a structure of conventional semiconductor apparatus. A semiconductor apparatus, which uses the packaging technology like the above and the Flip-Chip bonding technology, is a Flip-Chip Ball Grid Array (FCBGA) shown in FIG. 1. This has advantages for the shrinkage, miniaturization, and pin-multiplication of the package, as well as having a low wiring resistance compared with a wire bonding type of semiconductor package which bonds the semiconductor chip and the interposer substrate with a gold wire, thereby suitable for high speed operation. Therefore, an increase of the technology application is being expected. A material of the interposer substrate is divided into a resin material and a ceramic material. The resin material having advantages in manufacturing cost and in electrical characteristics has been mainly used. An example using the Flip-Chip bonding technology has been disclosed in Japanese Laid-Open Patent Publication No. 08-167630, in which a structure forming a wiring in a polymer material having a low thermal expansion coefficient close to that of silicon, and bonding a chip and the wiring with a through-hole is shown. Since a mounting area of this structure is decreased compared with the wire bonding, as well as shortening a bonding distance, and by using a material having a thermal expansion coefficient close to that of silicon, a thermal stress is also relaxed.

Up to now, a development of LSI has been carried out based on a scaling rule, in which if a dimension of a transistor is shrunk by 1/k, the density of the LSI becomes k2 times and an operation speed becomes k times. With a progress of the shrinkage and a demand for high speed operation, so-called, RC delay due to increase in a wiring resistance (R) and a capacitance (C) between wirings (hereinafter, referred to as wiring capacitance) has become not negligible. Therefore, employments of Cu as a wiring material for decreasing the wiring resistance and a low dielectric film (Low-k film) for an interlayer dielectric film for decreasing the wiring capacitance are supposed to be promising. In addition, for stable operation of LSI at high frequency region, a stabilization of power voltage and an arrangement of decoupling capacitor against a high frequency noise are essential. Therefore, a capacitor apparatus, which has a large capacitance formed on a silicon having a through-hole, or on a substrate composed of insulating film containing silicon, or on a sapphire substrate, and a module mounting the capacitor apparatus have been proposed. This is disclosed in Japanese Laid-Open Patent Publication No. 2002-008942.

In addition, because of high-scale integration of LSI and progress of pin-multiplication due to development of System-On-Chip technology configuring a system by forming, for example, various functional elements and memories on a single chip, a semiconductor chip still has a tendency to grow in size even after compensating contribution of the shrinkage and miniaturization by the electrode area alignment of the Flip-Chip.

However, according to the conventional technology, in the structure of Flip-Chip type of semiconductor apparatus shown in FIG. 1, when a resin substrate is used for the interposer substrate, a linear expansion coefficient of the resin substrate is around 15 ppm/C in contract with 2.6 ppm/C of that of semiconductor chip of which base material is mainly silicon. The difference is large, thereby causing a large internal stress within the semiconductor apparatus by the difference of thermal expansion coefficient between them. Currently, the reliability of the semiconductor apparatus is maintained by filling a resin in a space at bonding part between the semiconductor chip and the interposer substrate. However, by increase in internal stress due to growing in size of semiconductor chip according to increase of the number of external terminal in a future, it is predicted to become difficult to maintain the reliability. In the above-described Japanese Laid-Open Patent Publication No. 2002-008942, the semiconductor chip is bonded on an organic layer forming a capacitor. Then, the issue of thermal stress concentration due to the difference of the expansion coefficient has not been solved. In addition, including the bonding structure disclosed in Japanese Laid-Open Patent Publication No. 167630, the reliability of package mounted on the interposer substrate, of which thermal expansion coefficient is matched to that of silicon, is decreased due to an internal stress caused by the difference of thermal expansion coefficient when the package is mounted on a motherboard.

Furthermore, a dielectric constant of Low-k film, which is being supposed to be applied as a countermeasure for the RC delay, is decreased by doping, for example, fluorine, hydrogen, and organics in a silicon oxide ($SiO_2$) film, or making the material porous. Then, it is well known that the Low-k film is fragile compared with a conventional interlayer dielectric film such as silicon oxide film. This means a decrease in allowable limit of the internal stress caused by the difference of linear expansion coefficient between the semiconductor chip and the interposer substrate, and may cause a reliability issue when the shrinkage and pin-multiplication are further progressed in a future.

Moreover, recently, there is a tendency to replace a Tin-Lead solder, which has conventionally been used so far for the solder material, with a Lead-free solder. Electronics industries have a plan to abolish completely a solder containing Lead. The Lead-free solder, in which Tin is a base material, has a substantially small stress relaxation effect compared with the Tin-Lead solder, which has a stress relaxation effect to decrease a stress generated at the bonding part through composition change of solder itself. Accordingly, the internal stress increases, and may cause a reliability issue when the shrinkage and pin-multiplication are further progressed in a future.

DISCLOSURE OF THE INVENTION

It is therefore an object of the present invention to provide a semiconductor apparatus which is free from the above issues.

It is another object of the present invention to provide a semiconductor apparatus, in which an internal stress caused by the difference of thermal expansion coefficients in a wiring substrate is decreased, thereby increasing the reliability and capable of responding to further shrinkage and pin-multiplication.

It is a further object of the present invention to provide a wiring substrate of semiconductor apparatus which is free from the above issues.

It is a still further object of the present invention to provide a wiring substrate of semiconductor apparatus, in which an internal stress caused by the difference of thermal expansion coefficients in a wiring substrate is decreased, thereby increasing the reliability and capable of responding to further shrinkage and pin-multiplication.

It is a yet further object of the present invention to provide a method for manufacturing a wiring substrate of semiconductor apparatus which is free from the above issues.

It is an additional object of the present invention to provide a method for manufacturing a wiring substrate of semiconductor apparatus, in which an internal stress caused by the difference of thermal expansion coefficients in a wiring substrate is decreased, thereby increasing the reliability and capable of responding to further shrinkage and pin-multiplication.

According to a first aspect of the present invention, the present invention provides a semiconductor apparatus in which a semiconductor chip is mounted on a wiring substrate with Flip-Chip, wherein the wiring substrate comprising: a base substrate; a wiring layer having an insulating layer and a wiring formed on a wiring layer formation surface which is one surface of the base substrate; an electrode formed on a chip mounting surface which is a backside of the wiring layer formation surface of the base substrate; and a through-electrode formed on the base substrate electrically connecting the wiring layer formed on the wiring layer formation surface and the electrode formed on the chip mounting surface, wherein a thermal expansion coefficient of the base substrate is equal to a thermal expansion coefficient of the semiconductor chip, or less than a thermal expansion coefficient of the wiring layer, wherein the semiconductor chip is bonded to the chip mounting surface with face-down. In addition, it is favorable that the thermal expansion coefficient of the semiconductor chip is smaller than that of the wiring layer.

With the present configuration, since the semiconductor chip is mounted on the base substrate of the wiring substrate, the difference of thermal expansion between the semiconductor chip and the base substrate is suppressed. Therefore, a bonding reliability between the semiconductor chip and the wiring substrate is improved. When the present configuration is mounted on a motherboard substrate, since the wiring layer of the wiring substrate faces to the motherboard substrate and the wiring layer thereof exists between the motherboard substrate and the base substrate, a stress of the wiring layer caused by the difference of thermal expansion between the motherboard substrate and the base substrate can be relaxed, thereby resulting in increase of electric bonding reliability. In the explanation, a motherboard was used as an example for explaining a substrate on which the wiring substrate of the present invention is mounted, but not limited to the motherboard. Any substrate, on which the wiring substrate of the present invention is mounted and which is different from the base substrate, may be possible. In the present embodiment, a support means a substrate which is different from the base substrate, and on which the wiring substrate of the present invention is mounted.

The base substrate may be any one of a silicon, a ceramic, and a photosensitive glass.

A reinforcing frame may be stuck at least on a part of outer part of the chip mounting position of the chip mounting surface. In addition, it is favorable that the thermal expansion coefficient of the reinforcing frame is equal to the thermal expansion coefficient of the semiconductor chip, or less than that of the wiring layer.

A thickness of the base substrate, at least one part of outer part of the semiconductor chip mounting position at the chip mounting surface, may be thicker than the other part of the semiconductor chip mounting position at the chip mounting surface.

A functional element may be formed on at least any one of the wiring layer formation surface and the wiring layer.

According to a second aspect of the present invention, the present invention provides a wiring substrate which mounts a semiconductor chip with Flip-Chip, wherein the wiring substrate comprising: a base substrate; a wiring layer having an insulating layer and a wiring formed on a wiring layer formation surface which is one surface of the base substrate; an electrode formed on a chip mounting surface which is a backside of the wiring layer formation surface of the base substrate; and a through-electrode formed on the base substrate electrically connecting the wiring layer formed on the wiring layer formation surface and the electrode formed on the chip mounting surface, wherein a thermal expansion coefficient of the base substrate is equal to a thermal expansion coefficient of the semiconductor chip, or less than a thermal expansion coefficient of the wiring layer. It is favorable that the thermal expansion coefficient of the semiconductor chip is smaller than that of the wiring layer.

With the present configuration, the above-described advantages are obtained for the semiconductor apparatus according to the first aspect of the present invention.

A material of the base substrate may be composed of any one of a silicon, a ceramic, and a photosensitive glass.

A reinforcing frame may be stuck at least on a part of outer part of the chip mounting position of the chip mounting surface. It is favorable that a thermal expansion coefficient of the reinforcing frame is equal to that of the semiconductor chip, or less than that of the wiring layer.

A thickness of the base substrate, at least one part of outer part of the semiconductor chip mounting position at the chip mounting surface, may be thicker than the other part of the semiconductor chip mounting position at the chip mounting surface.

A functional element may be formed on at least any one of the wiring layer formation surface and the wiring layer.

According to a third aspect of the present invention, the present invention provides a method for manufacturing a wiring substrate which comprises a base substrate and a wiring layer having an insulating layer and a wiring formed on a wiring layer formation surface, which is one surface of the base substrate, and mounts a semiconductor chip with Flip-Chip, the method comprising steps of: forming a half-through-hole from the wiring layer formation surface of the base substrate; forming a first electrode on the wiring layer formation surface by burying the half-through-hole with an electrically conductive material; forming the wiring layer on wiring layer formation surface; and forming a second electrode for mounting the semiconductor chip by exposing the half-through-hole through thinning the base substrate from a backside of the wiring layer formation surface.

The method for manufacturing a wiring substrate may further comprise a step of thinning the base substrate by maintaining a step between at least one part of outer part of a semiconductor chip mounting position and other part of the semiconductor chip mounting position, by making a work amount smaller at least at the one part of outer part of the semiconductor chip mounting position than the other part of semiconductor chip mounting position.

The method for manufacturing a wiring substrate may further comprise a process of forming a functional element at a process which forms the wiring layer.

According to a fourth aspect of the present invention, the present invention provides a method for manufacturing a wiring substrate which comprises a base substrate and a wiring layer formed on a wiring layer formation surface, which is one surface of the base substrate, and mounts a semiconductor chip with Flip-Chip, the method comprising steps of: forming the wiring layer on wiring layer formation surface of the base substrate; forming a through-hole which penetrates only the base substrate from a backside of the wiring layer formation surface of the base substrate; forming an electrode for mounting the semiconductor chip at the backside of the wiring layer formation surface by burying the through-hole with an electrically conductive material.

The method for manufacturing a wiring substrate may further comprise a step of thinning the base substrate by keeping a step between at least one part of outer part of a semiconductor chip mounting position and the other part of semiconductor chip mounting position, by making a work amount smaller at least at the one part of outer part of the semiconductor chip mounting position than the other part of semiconductor chip mounting position.

The method for manufacturing a wiring substrate may further comprise a process of forming a functional element at a process which forms the wiring layer.

According to the aspects of the first to the fourth embodiments explained in the above, in the semiconductor apparatus, the wiring substrate, and the method for manufacturing the wiring substrate, since the semiconductor chip is bonded to the base substrate of the wiring substrate which has a thermal expansion coefficient close to that of the semiconductor chip, an internal stress caused by mismatch of the thermal expansion coefficient between them is substantially decreased. In addition, a change of an internal stress caused by mounting the semiconductor apparatus on a motherboard and by temperature change under operating circumstances is also decreased, thereby resulting in increase in the reliability. Accordingly, it becomes possible to overcome a decrease of allowance level of the internal stress due to, for example, growing in size of semiconductor chip according to increase in the number of external terminal, due to application of fragile Low-k film to the interlayer dielectric film, and due to a decrease of stress relaxation by using an environmentally-friendly lead-free solder.

In addition, since the wiring layer of the wiring substrate is formed on a rigid base substrate, it is suitable for forming a fine wiring pattern. Furthermore, since most of manufacturing processes of the semiconductor apparatus can be implemented with a wafer, a high production efficiency is achieved, and thereby resulting in a low cost manufacturing.

Further, a stress is caused by the difference of thermal expansion coefficient between the base substrate and a resin material used for the interlayer dielectric film substantially occupying the wiring layer, which is formed at a backside of the chip mounting surface of the wiring substrate. However, by sticking a reinforcing frame partially or entirely to the outer part of the mounting position of the semiconductor chip at the chip mounting surface, the rigidity of the base substrate is maintained even if the thickness of base substrate at the semiconductor chip mounting position is substantially thinned. As a result, it becomes possible to improve the mountability and the reliability by suppressing warpage of the wiring substrate.

Moreover, a stress is caused by the difference of thermal expansion coefficient between the base substrate and a resin material used for the interlayer dielectric film substantially occupying the wiring layer, which is formed at a backside of the chip mounting surface of the wiring substrate. However, by increasing the thickness partially or entirely of the outer part of the mounting position of the semiconductor chip at the chip mounting surface, the rigidity of the base substrate is maintained even if the thickness of base substrate at semiconductor chip mounting position is substantially thinned. As a result, it becomes possible to increase the mountability and the reliability by suppressing warpage of the wiring substrate, as well as increasing simplicity of the process by simultaneous formation of the surrounding step when the base substrate is thinned. Then, the cost can be down.

In addition, by disposing, for example, a capacitor, a resistor, and a inductor on the surface of base substrate for forming a wiring layer, or in the wiring layer, an optimum arrangement of functional elements, for example, the capacitor, the resistor and the inductor, is achieved at each optimum position in the wiring substrate. As a result, improvements of high frequency characteristics and a high performance can be achieved. Shrinkage of the mounting area and an increase of design freedom are also achieved.

Furthermore, by stacking the wiring layer on the base substrate which has a small thermal expansion coefficient and a high rigidity, it becomes possible to form a fine wiring pattern compared with the case where the wiring layer is stacked on a resin-based base material.

PREFERRED EMBODIMENTS OF THE PRESENT INVENTION

First Embodiment

Figure 1:
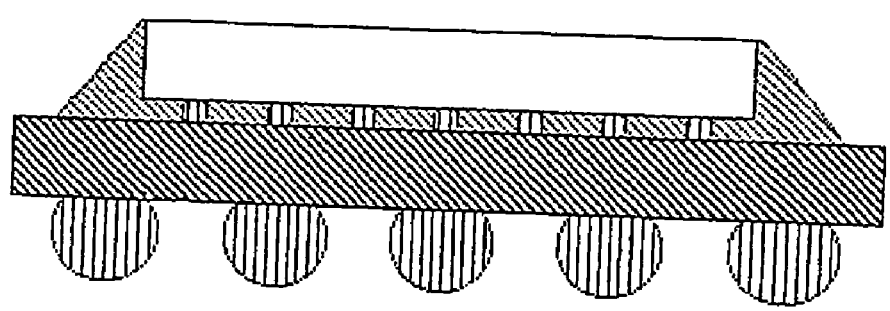
FIG. 1 is a cross sectional view showing a structure of conventional semiconductor apparatus.
Figure 2A:
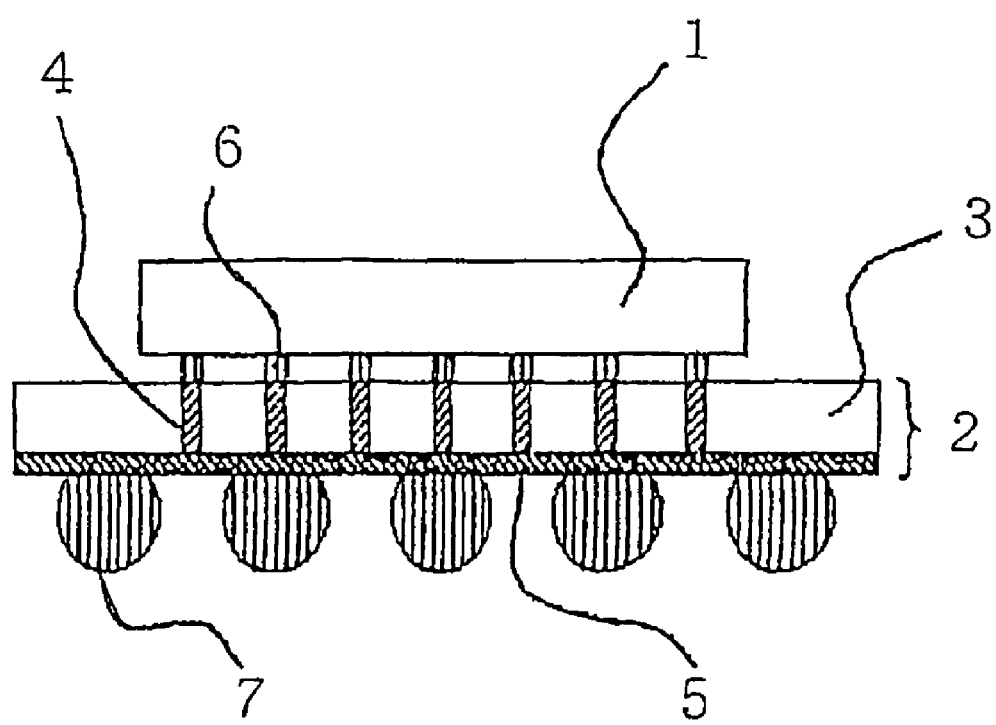
FIG. 2A is a cross sectional view showing a structure of first example of semiconductor apparatus in the first embodiment of the present invention.
Figure 2B:
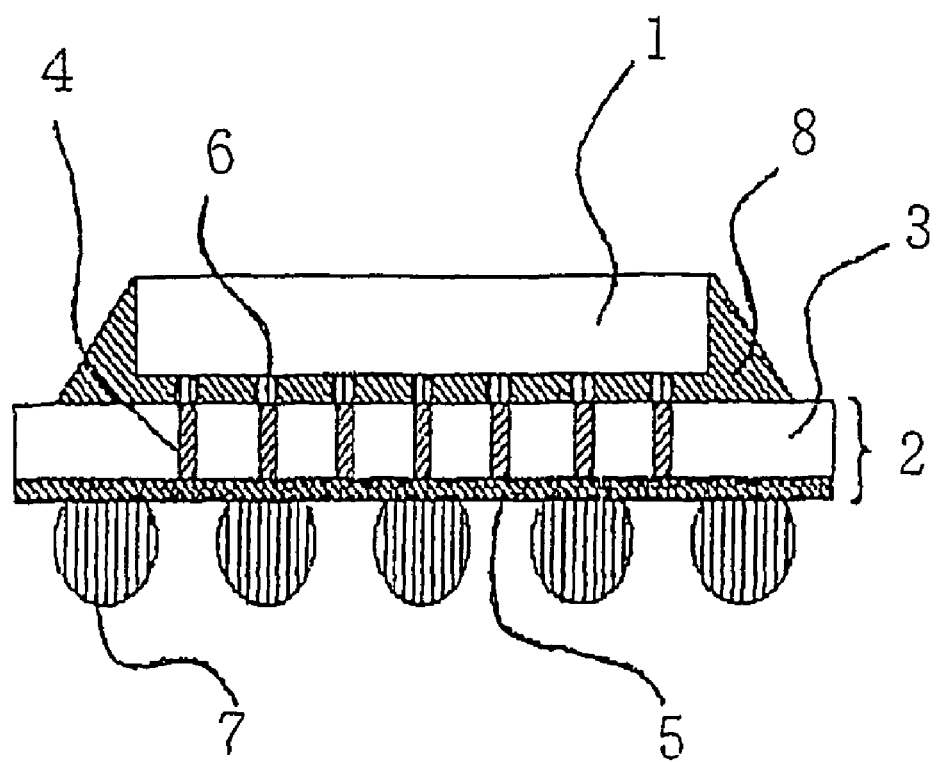
FIG. 2B is a cross sectional view showing a structure of second example of semiconductor apparatus in the first embodiment of the present invention.
Figure 2C:
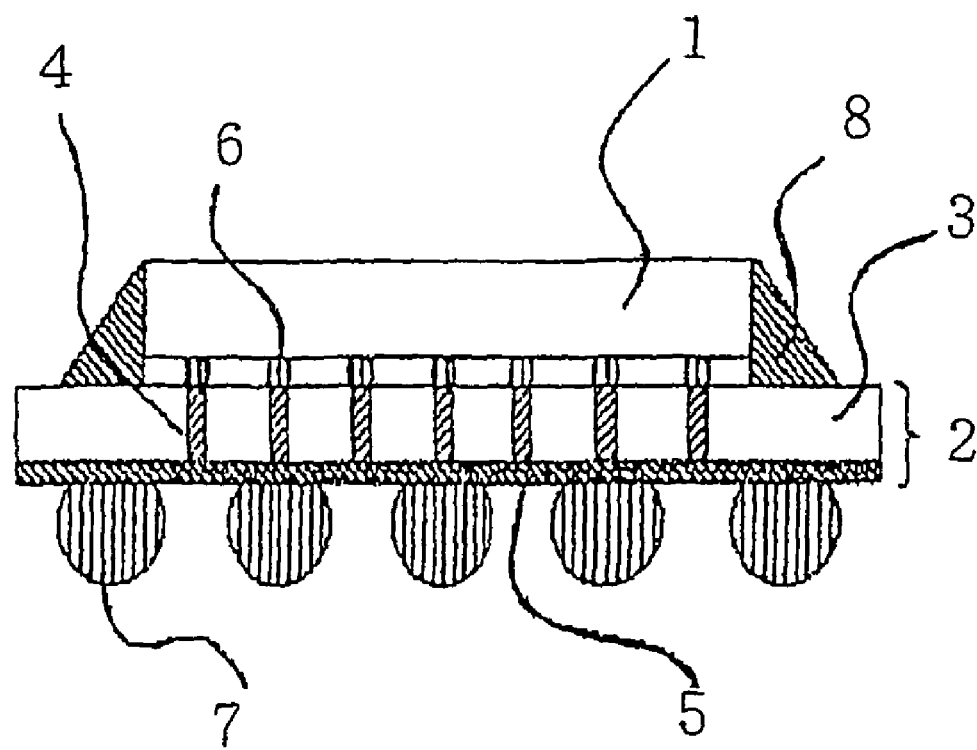
FIG. 2C is a cross sectional view showing a structure of third example of semiconductor apparatus in the first embodiment of the present invention.

Embodiments of the present invention will be explained in detail by referring to figures. FIG. 2A is a cross sectional view showing a structure of a first example of a semiconductor apparatus in the first embodiment of the present invention. FIG. 2B is a cross sectional view showing a structure of a second example of a semiconductor apparatus in the first embodiment of the present invention. FIG. 2C is a cross sectional view showing a structure of a third example of a semiconductor apparatus in the first embodiment of the present invention. FIGS. 3A to 3F are cross sectional views of a wiring substrate at each process of a method for manufacturing the wiring substrate of the semiconductor apparatus in the first embodiment of the present invention.

In the first embodiment, as shown in FIG. 2A, a single or plural wiring layers 5 is formed on one side of base substrate 3 which is composed of silicon as a wiring substrate 2, and on an electrode at the top layer of wiring layer 5, bump 7 for external bonding is formed. In base substrate 3, through-electrode 4 is formed for electrically connecting wiring substrate 5 and an electrode terminal on the other side of base substrate 3 on which wiring layer 5 is not formed (hereinafter, referred to as chip mounting surface). The electrode terminal on the chip mounting surface and semiconductor chip 1 are electrically and mechanically bonded with internal bonding bump 6 which is composed of, for example, Tin-Lead solder.

A thermal expansion coefficient of base substrate 3, which is composed of silicon, is substantially equal to that of semiconductor chip 1 and less than that of wiring layer 5. Then, a stress caused by the difference of thermal expansion coefficient between semiconductor chip 1 and base substrate 3 is substantially small. Therefore, as shown in FIG. 2A, it is not always necessary to bury a space between semiconductor chip 1 and wiring substrate 2 with mold compound such as an epoxy-based resin for partially supporting a bonding strength between them. As shown in FIG. 2B, it may be possible to bury the space between semiconductor chip 1 and wiring substrate 2 with mold compound 8 without putting overstress to the bonding part. It may also be possible, as shown in FIG. 2C, to bury only a perimeter of semiconductor chip 1 with mold compound 8.

Next, a method for manufacturing the wiring substrate in a first embodiment will be explained by referring to FIGS. 3A to 3F.

Figure 3A:
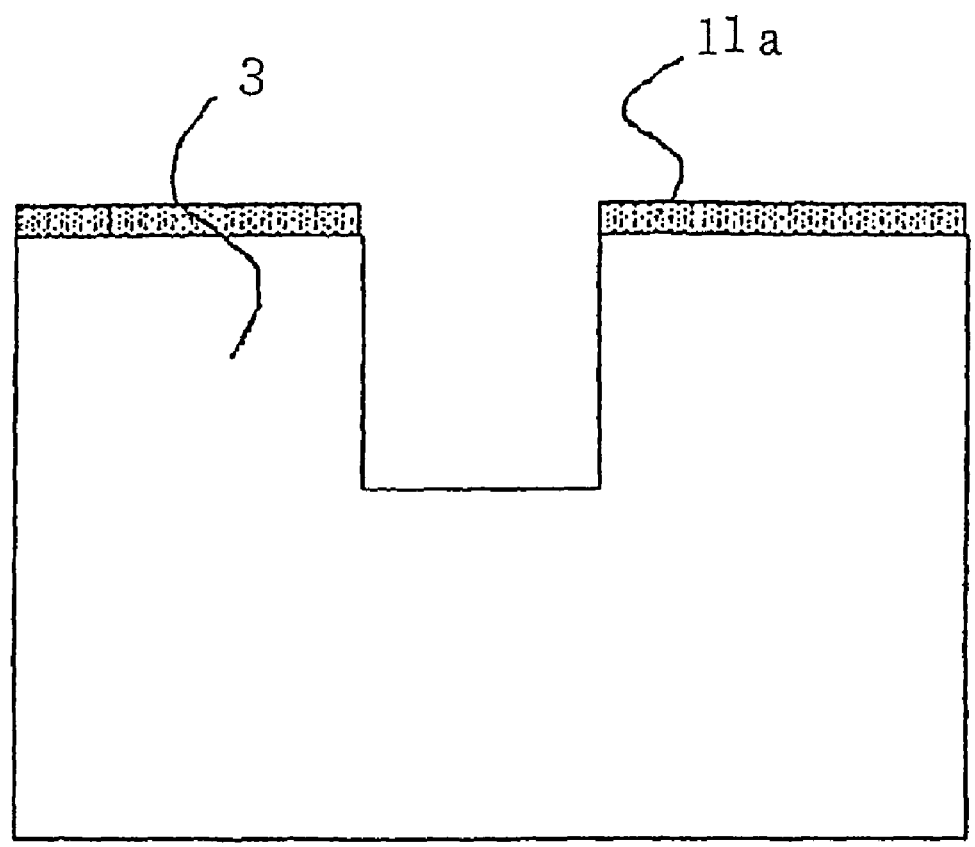
FIG. 3A to 3F are cross sectional views of a wiring substrate at each process of a method for manufacturing the wiring substrate of the semiconductor apparatus in the first embodiment of the present invention.

As shown in FIG. 3A, after forming a silicon oxide film (SiO2 film) of insulating layer 11a on a silicon wafer of base substrate 3, insulating layer 11a is bored by patterning a predetermined hole position with photolithography. Then, a half-through-hole of 110 μm in depth is formed with reactive ion etching (RIE). A diameter of the half-through-hole was set at 80 μm. A distance between the holes was 150 μm. The RIE is a method for removing the oxide through reactions of radical atom in the reactive gas plasma. It is possible to conduct anisotropic etching with RIE like dry etching.

Figure 3B:
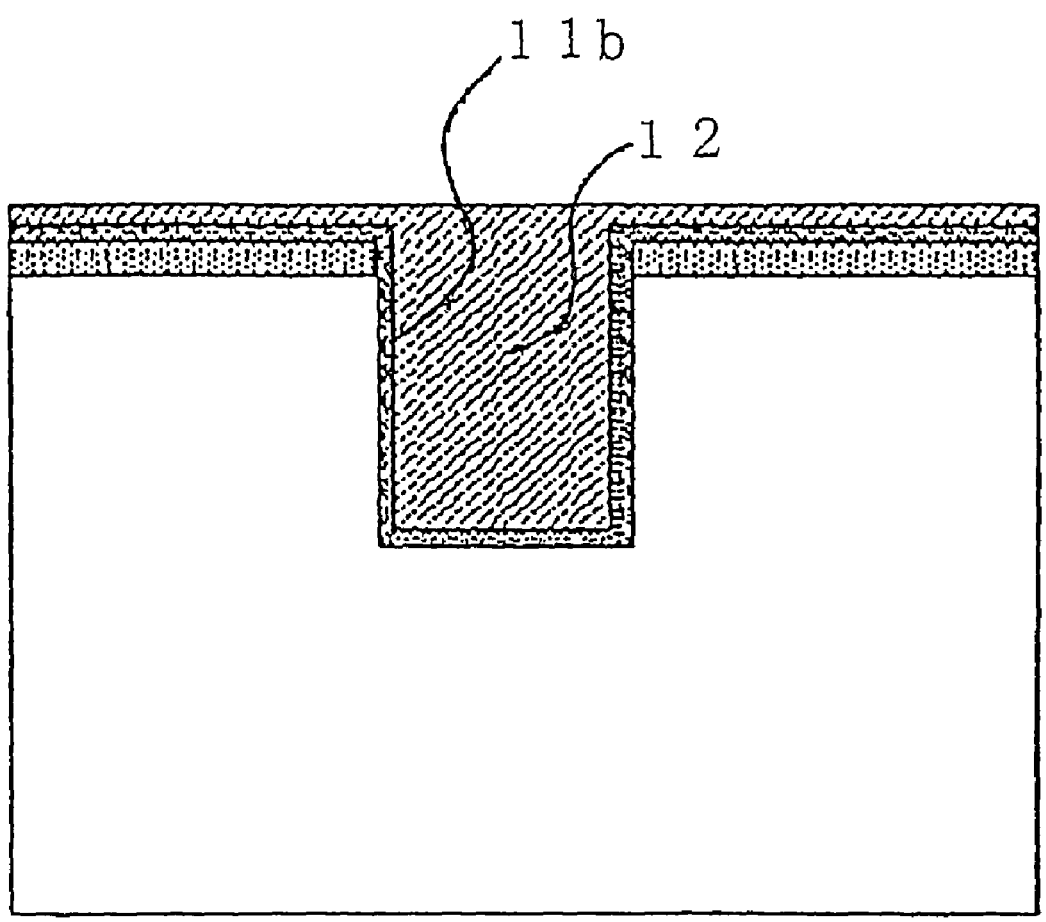

Next, as shown in FIG. 3B, a TEOS (Si(OC2H5)4) film of insulating layer 11b is formed on a surface of the half-through-hole with plasma CVD, followed by a copper (Cu) film formation of a plating seed layer with sputtering. When a film is formed by CVD on whole surface of a hole which has a substantially deep depth as the present structure, it is difficult to form the film on a side wall of the hole due to a shape of the hole thereof. Therefore, the TEOS film, which has good step coverage from the beginning of film formation, was selected as insulating layer 11b. After that, the half-through-hole was filled with conductor 12 of Cu with plating of a damascene method, and chemical-mechanical polished (CMP) for planarization of conductor 12. Other than the damascene method, a method filling the conductor with CVD is also possible. Other than the metal, an electrically conductive resin may also be usable for the conductor.

Figure 3C:
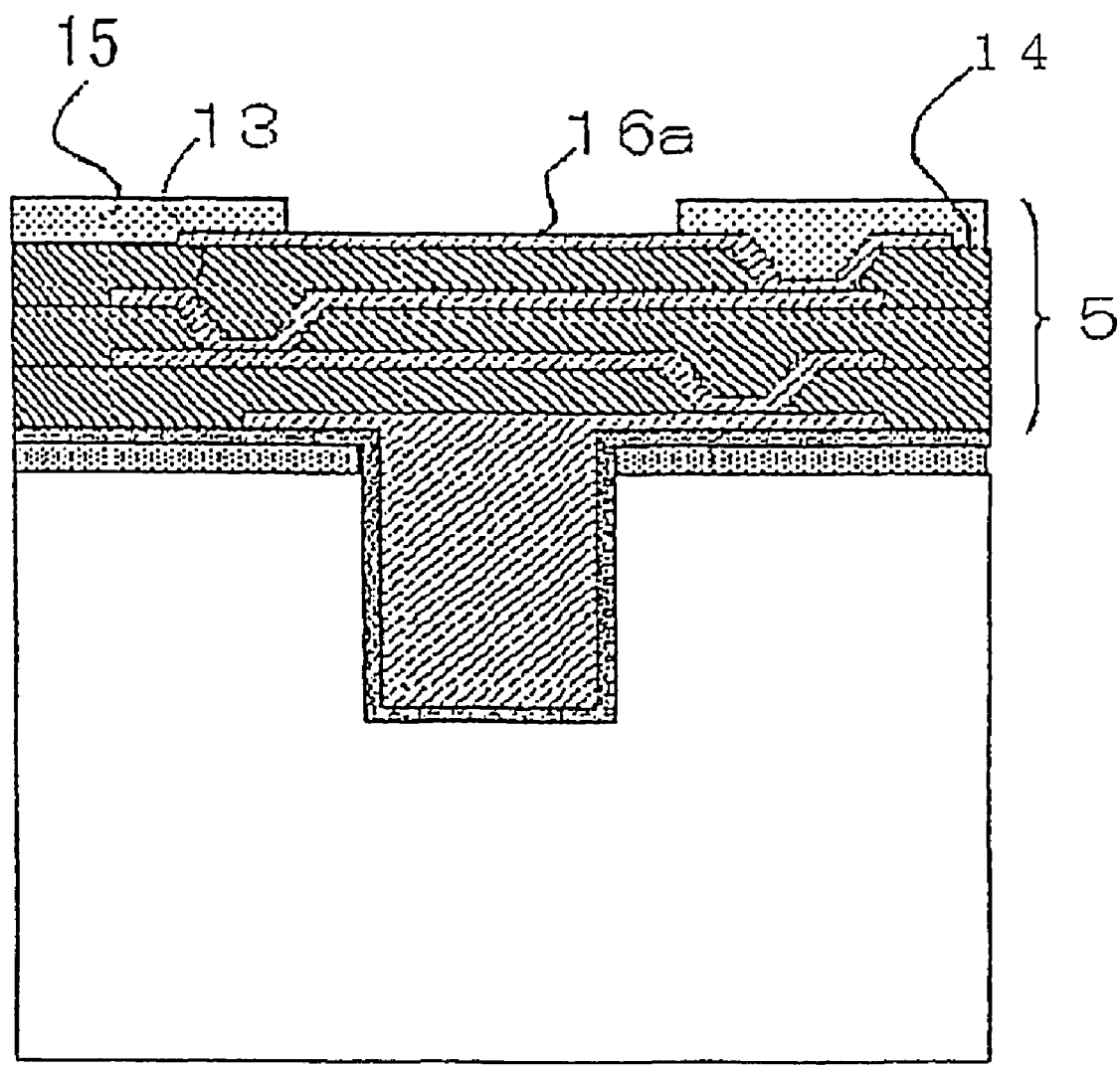

Next, as shown in FIG. 3C, after patterning the CMP treated Cu film at upper layer with etching, wiring layer 5 is formed with a buildup method for forming a multilayer wiring layer by sequentially repeating formation of interlayer dielectric film 14, formation of a via hole, desmear treatment, and formation of wiring 13. In FIG. 3C, an example of wiring layer with three levels is shown, but not limited to three levels.

An increase in operation speed can be expected by fabricating functional apparatus, for example, a capacitor, a resistor, and an inductor during formation of wiring layer 5. For example, a decoupling capacitor function can be obtained by inserting a parallel plate capacitor formed by sandwiching ferroelectric material, which is formed as a part of interlayer dielectric film 14, with a power line and a ground line within wiring layer 5. After that, the surface is covered with solder resist, such as polyimide, except electrode 16a of the top wiring layer. Then, a structure at an external bonding bump side is completed.

Functional elements, for example, a capacitor, a resistor, and an inductor are fabricated in wiring layer 5. It is possible to apply a conventional semiconductor diffusion process for fabricating the functional elements since they are formed on a silicon which is able to form a functional element such as a capacitor by applying a thin film process on the silicon substrate, which has a via buried with conductive material. Therefore, it is possible to achieve a manufacturing line with precise manufacturing and low cost production, for example, through suppressed investment.

Figure 3D:
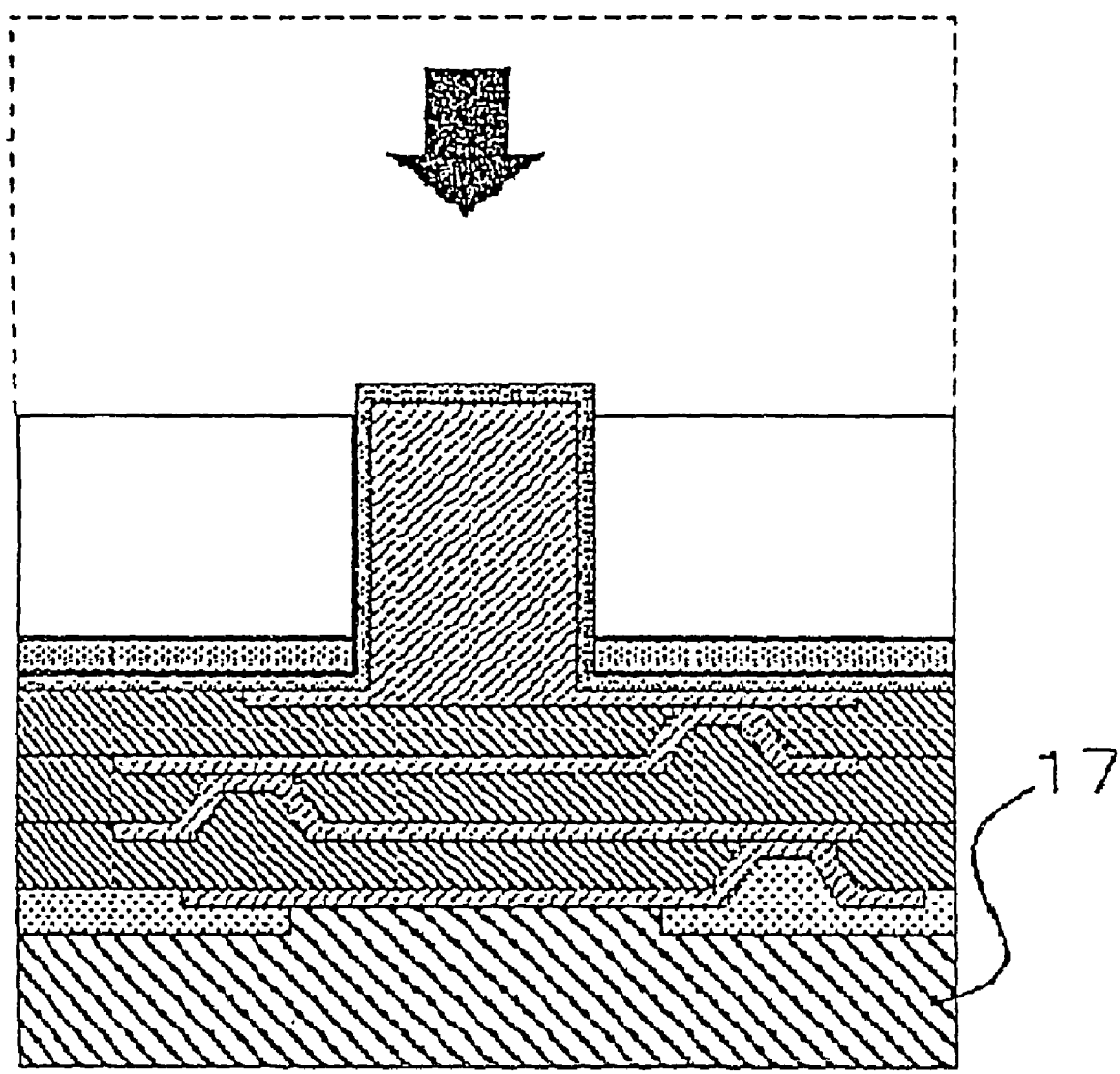

Next, as shown in FIG. 3D, for protecting a surface at a wiring layer formation side, the surface is covered with support 17 before a thinning treatment of silicon. After turning over the silicon wafer, the silicon is thinned from about 700 μm to about 200 μm with mechanical grinding. Then, the silicon is further thinned to about 100 μm with RIE for exposing the half-through-hole.

In the first embodiment, a combination of mechanical grinding and RIE has been employed for the thinning considering the manufacturing cost and the manufacturing efficiency. After the mechanical grinding, a strained layer is formed at the surface in general. A micro-crack is also formed in some case. Since there is a possibility that these decrease the reliability, a careful consideration for conditions, for example, on removal rate of the mechanical grinding and the chasing speed, is required. The thinning process can be achieved with only mechanical grinding if it does not effect on the reliability.

Figure 3E:
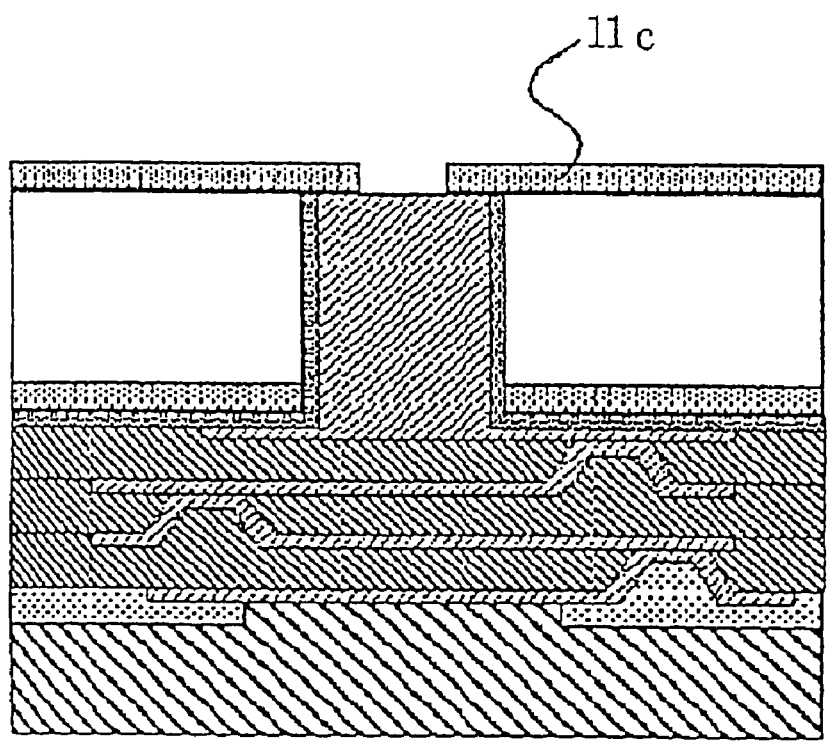

Next as shown in FIG. 3E, after RIE treatment, a step appears due to the difference of etching rate caused by the difference of material between the through-electrode area and the other area. After that, the cupper is exposed by entirely removing insulating layer 11b with CMP as well as planarizing the RIE treated surface. Then, a SiO2 film of insulating layer 11c is formed on the surface, and patterning is conducted on the film with photolithography.

Figure 3F:
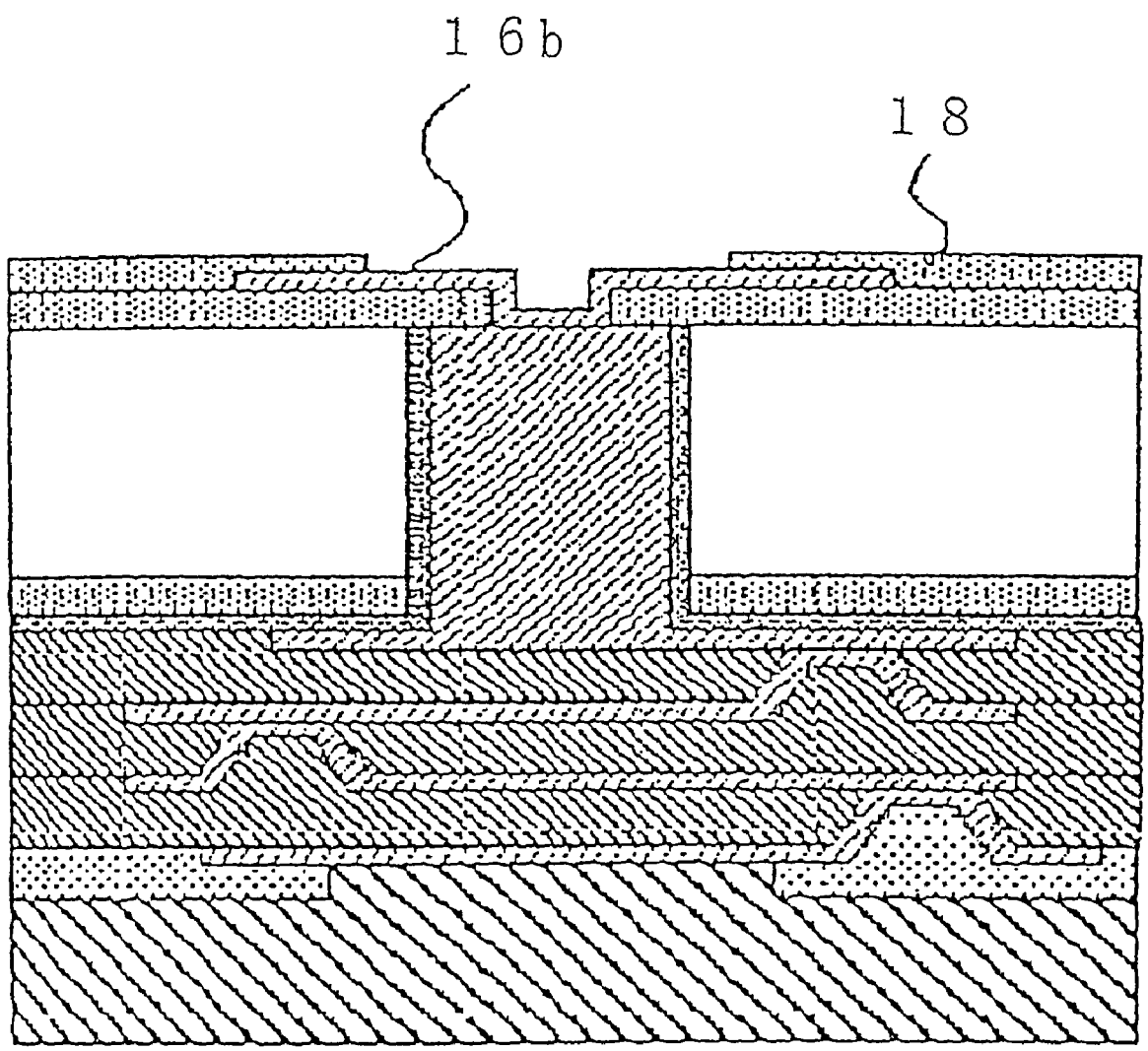

Finally, as shown in FIG. 3F, after forming a second electrode 16b on the opening area of insulating layer 11c, cover film 18 of silicon nitride film (SiN film) is formed. After that, by removing support 17, the wiring substrate is completed. In the first embodiment, SiO2 and SiN have been used for the insulating layers 11a, 11b, 11c, and cover film 18. However, other than the above materials, SiC, SiOF, and SiOC formed with plasma CVD, which is capable of forming a film at substantially low temperature, can also be used for the film.

Semiconductor chip 1 is mounted with face-down on wafer shaped wiring substrate 2 which was manufactured through processes shown in FIGS. 3A to 3F. After reinforcing semiconductor chip 1 with mold compound 8 appropriately, semiconductor chip 1 is separated individually, and external bonding bump 7 is formed to complete a semiconductor apparatus. In this manufacturing process, since the wafer shape is maintained until close to the final process, the manufacturing efficiency is high and manufacturing and inspection costs can be cut down.

When a chip size of semiconductor chip 1 is over 10×10 mm and the number of external output pin is over 1000, wiring substrate 2 becomes large, such as 40~50 mm. In this case, the thinned silicon substrate has not a sufficient mechanical strength. Then, there may be a possibility to break wiring substrate 2 during the separation of the chip individually. Therefore, it is favorable to cut wiring substrate 2 after backing up it by taping with stiffener 9 before cutting wiring substrate 2, after thinning the silicon and forming a bonding electrode of the semiconductor chip. In addition, if manufacturing of the wiring substrate and mounting of semiconductor chip can be implemented sequentially, it is favorable to mount semiconductor chip 1 on the wiring substrate as a wafer, and after that, to implement the separation process.

In the present invention, a material, which is able to relax the difference of thermal expansion between a supporting substrate exemplified by a motherboard and the wiring substrate, may be used for the insulating layer. It is favorable that the material is selected considering expansion coefficients of the supporting substrate and the base substrate. Optimally, an expansion coefficient of the material for the insulating layer is smaller than that of the supporting substrate, and larger than that of the base substrate.

In the first embodiment, silicon is used for semiconductor chip 1 and base substrate 3 of wiring substrate 2, but not limited to the silicon. For base substrate 3, a material, of which thermal expansion coefficient is equal to that of semiconductor chip 1 or smaller than that of wiring layer 5, is used. Other than the silicon, for example, ceramics or a photosensitive glass which is able to form a fine hole can be used. If the photosensitive glass is selected as base substrate 3, a through-hole is formed first instead of the half-through-hole. After that, an electrically conductive treatment for both sides of the glass plate and a wiring layer formation are conducted. Practically, by putting a mask which has a pattern for forming a hole on the photosensitive glass, an exposure process with a violet light which includes a predetermined spectrum, and a development process with a heat treatment are conducted. Then, a crystallized part is removed with acid to form base substrate 3 having a through-hole.

Second Embodiment

Figure 4:
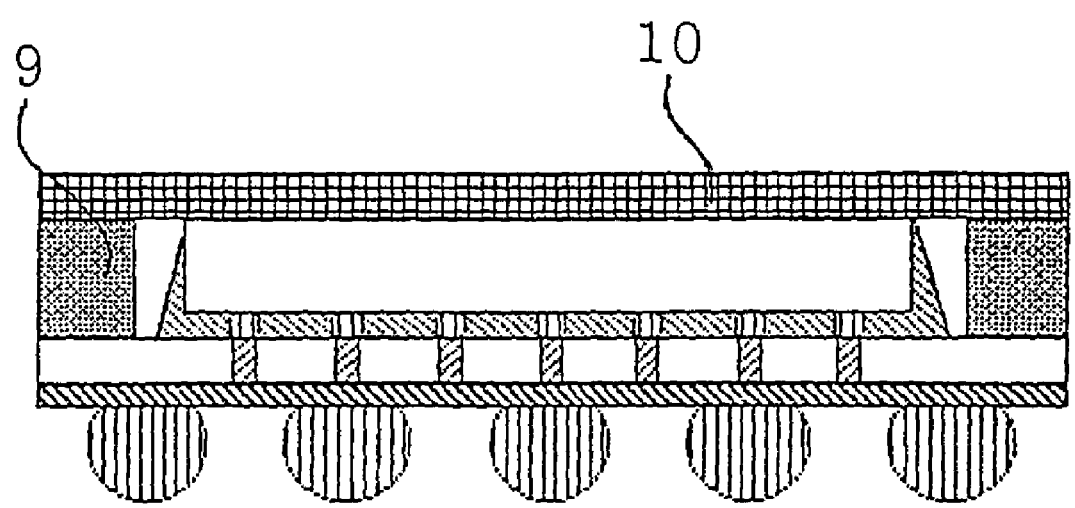
FIG. 4 is a cross sectional view showing a structure of semiconductor apparatus in the second embodiment of the present invention.

FIG. 4 is a cross sectional view showing a structure of semiconductor apparatus in the second embodiment of the present invention. In the second embodiment, in addition to the configuration of the first embodiment, a stiffener 9 of reinforcing frame is stuck at around a mounting surface area of semiconductor chip 1 on base substrate 3 for increasing rigidity of wiring substrate 2. Since the rigidity of wiring substrate 2 can be increased with stiffener 9, it is possible to thin the thickness of a package by thinning base substrate 3, and to provide countermeasures for increasing cooling performance against the increase of power consumption and heat generation of semiconductor chip 1 by attaching heat sink 10 at the bottom of semiconductor chip 1 using stiffener 9. It is also favorable that a thermal expansion coefficient of stiffener 9 is equal to that of semiconductor chip 1, or less than that of wiring layer 5, as well as the case of base substrate 3.

Third Embodiment

FIG. 5A to 5E are cross sectional views of a wiring substrate at each process of a method for manufacturing a wiring substrate of a semiconductor apparatus in a third embodiment of the present invention.

Figure 5A:
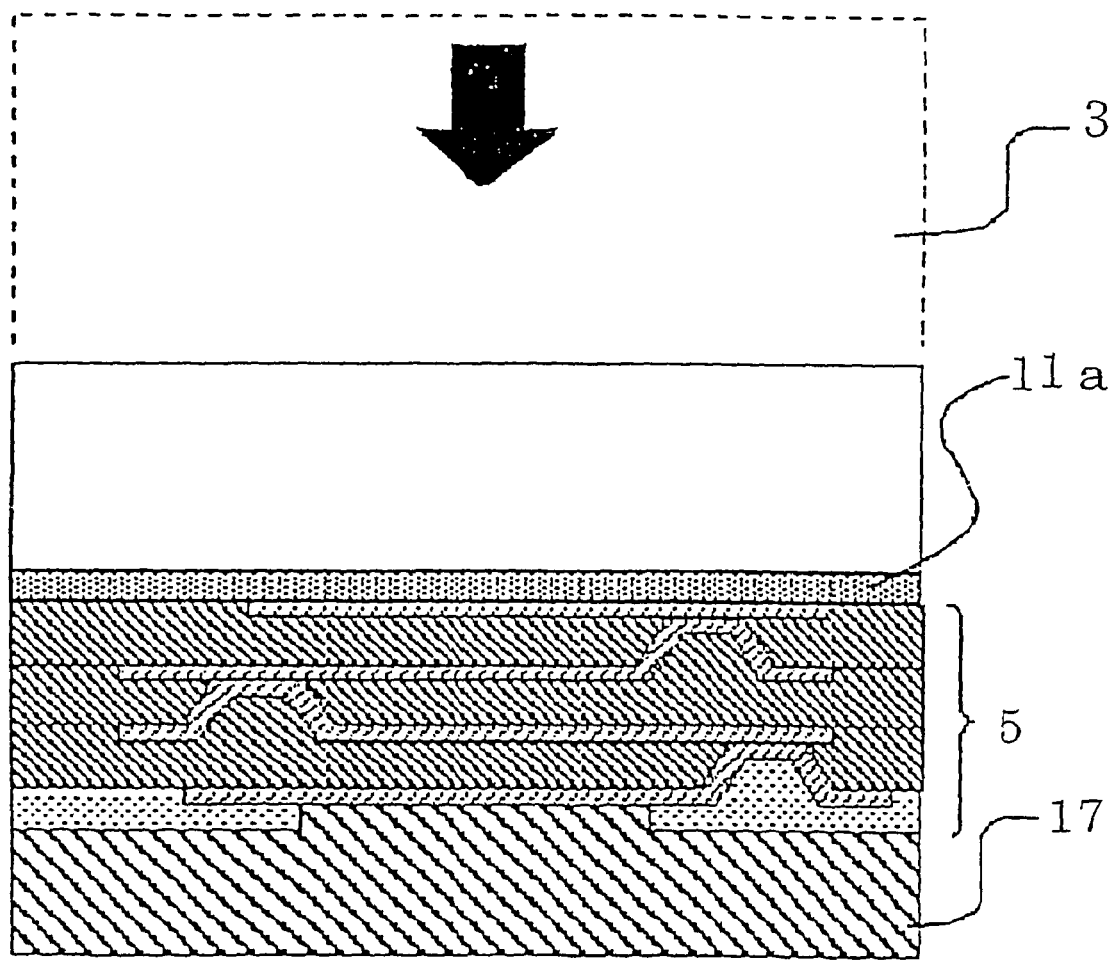
FIG. 5A to 5E are cross sectional views of a wiring substrate at each process of a method for manufacturing the wiring substrate of the semiconductor apparatus in the third embodiment of the present invention.

In the first embodiment, wiring layer 5 is formed after forming a half-through-hole in base substrate 3, and burying the half-through-hole with an electrically conductive material. However, in the third embodiment, after forming wiring layer 5 first on base substrate 3, wiring substrate 2 is completed by forming a through-electrode and a backside electrode First, as shown in FIG. 5A, insulating layer 11a and wiring layer 5 are formed on base substrate 3 of silicon having a thickness of 700 μm with the same manufacturing method as the first embodiment.

After protecting a surface of wiring layer 5 with support 17, the wafer is turned over and base substrate 3 is thinned to 180 μm from backside with mechanical grinding. Then, a central part of base substrate 3 is thinned to 80 μm with RIE. Although not shown since FIG. 4 is an enlarged illustration, when RIE is conducted, a width of 8.5 mm at peripheral area of the substrate is masked. Accordingly, a step is formed on the surface by further thinning of the central area with RIE. With the above, a thickness of the through-electrode area can be further thinned, while maintaining rigidity of base substrate 3. In this embodiment, an outside dimension of wiring substrate 2 is 30×30 mm, an outside dimension and a thickness of semiconductor chip 1 are 10×10 mm and 700 μm, respectively. In this embodiment, the though-hole part and its surrounding are unified with the same material. However, as with the second embodiment, the rigidity is secured by sticking stiffener 9 around a smooth surface of wiring substrate 2.

Figure 5B:
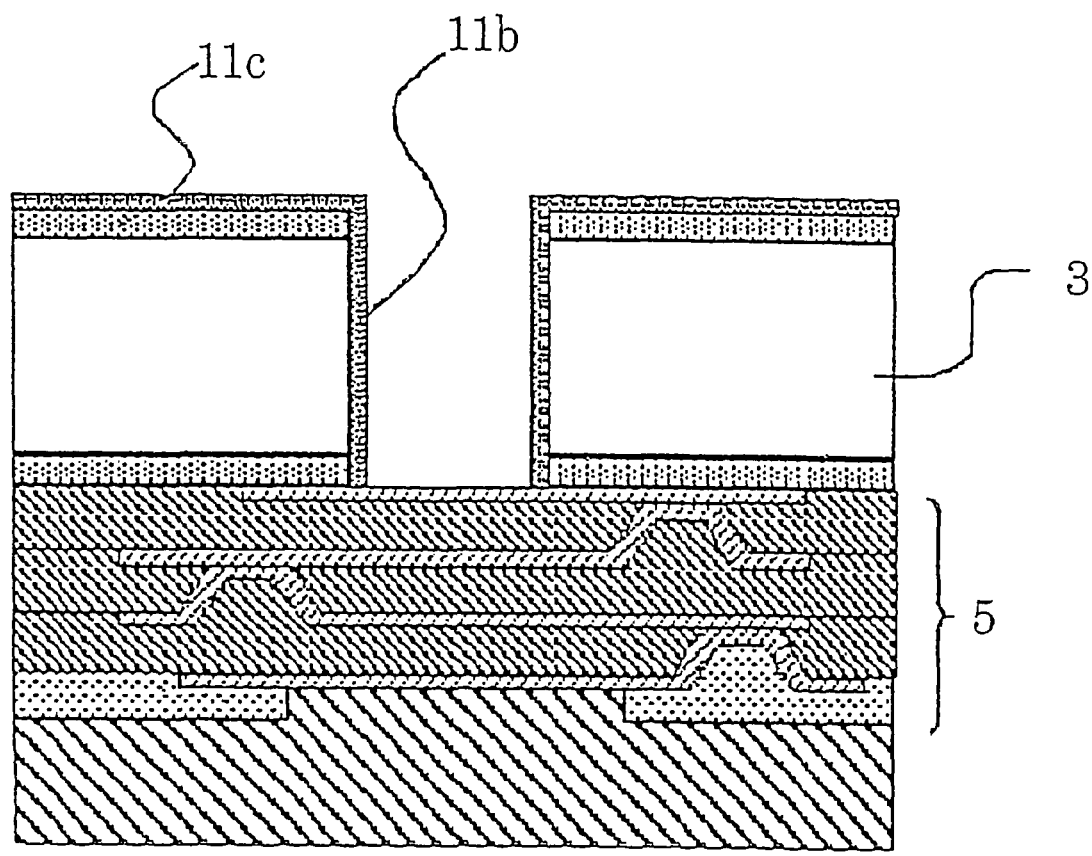
Figure 5C:
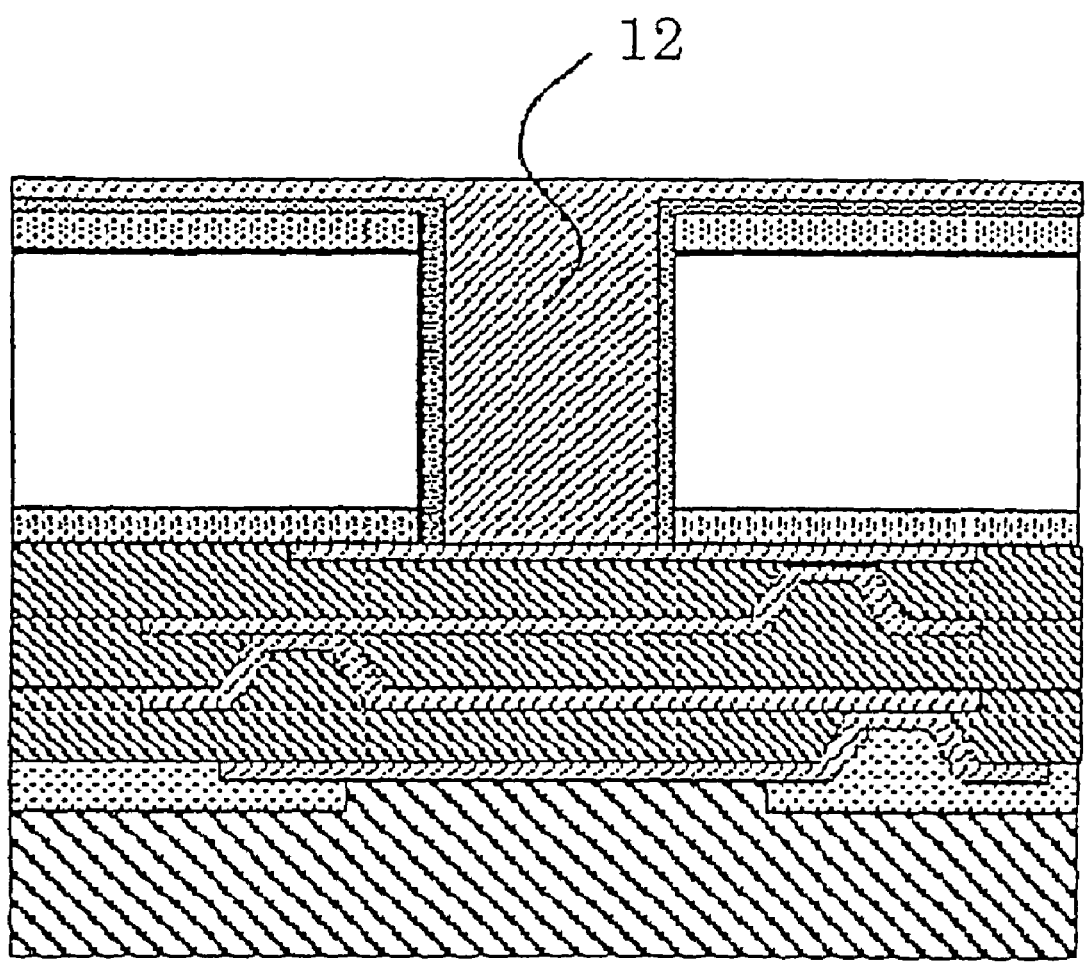
Figure 5D:
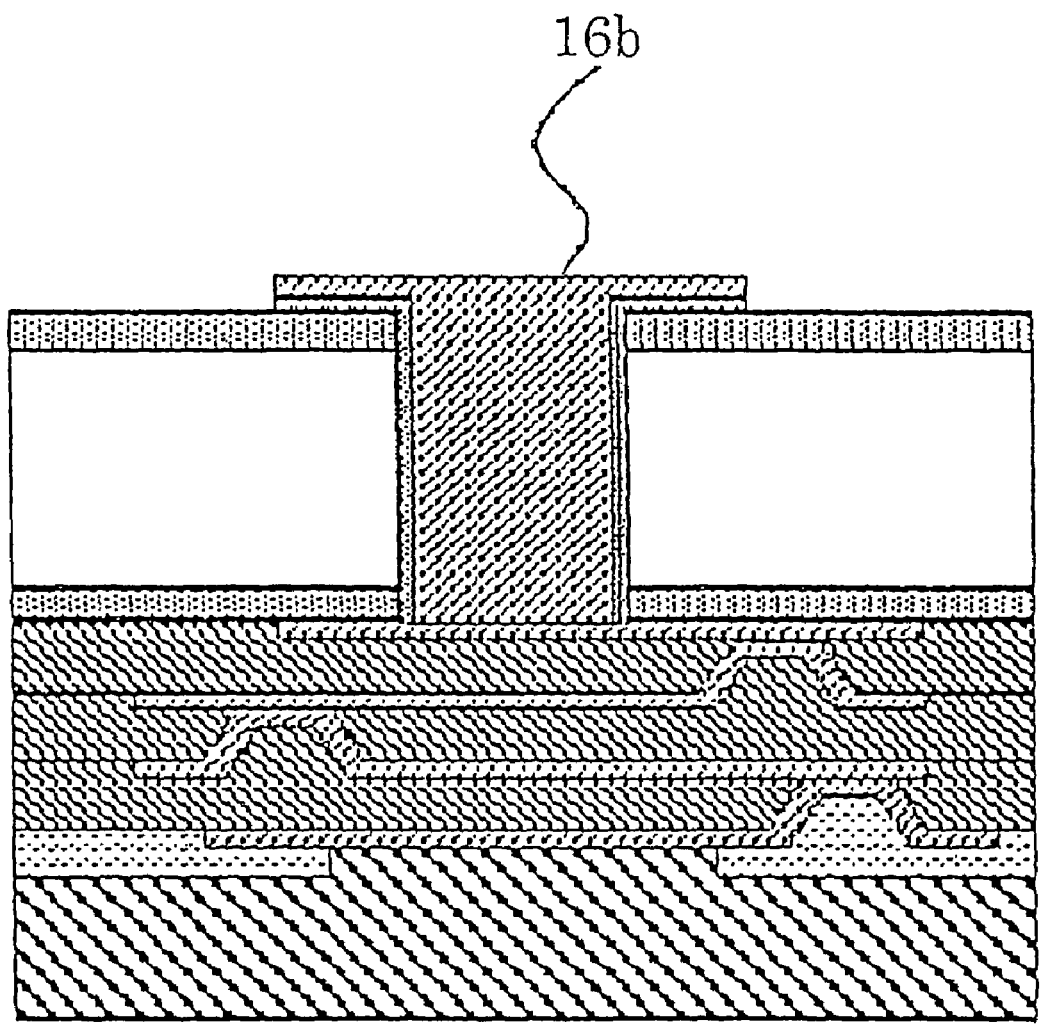

Next, as shown in FIG. 5B, after forming SiO2 film of insulating layer 11c on a silicon wafer of base substrate 3, insulating layer 11c is bored after pattering a predetermined hole position with photolithography, and a through-hole is formed with RIE for exposing a wiring at the bottom of wiring layer 5. After that, a side wall and an upper surface of the through-hole are insulated with insulating layer 11c of TEOS film.

Then, the through-hole is filled with a conductor 12 of Cu with a damoscene method, and chemical-mechanical polished (CMP) for planarization. After that, as shown in FIG.

Figure 5E:
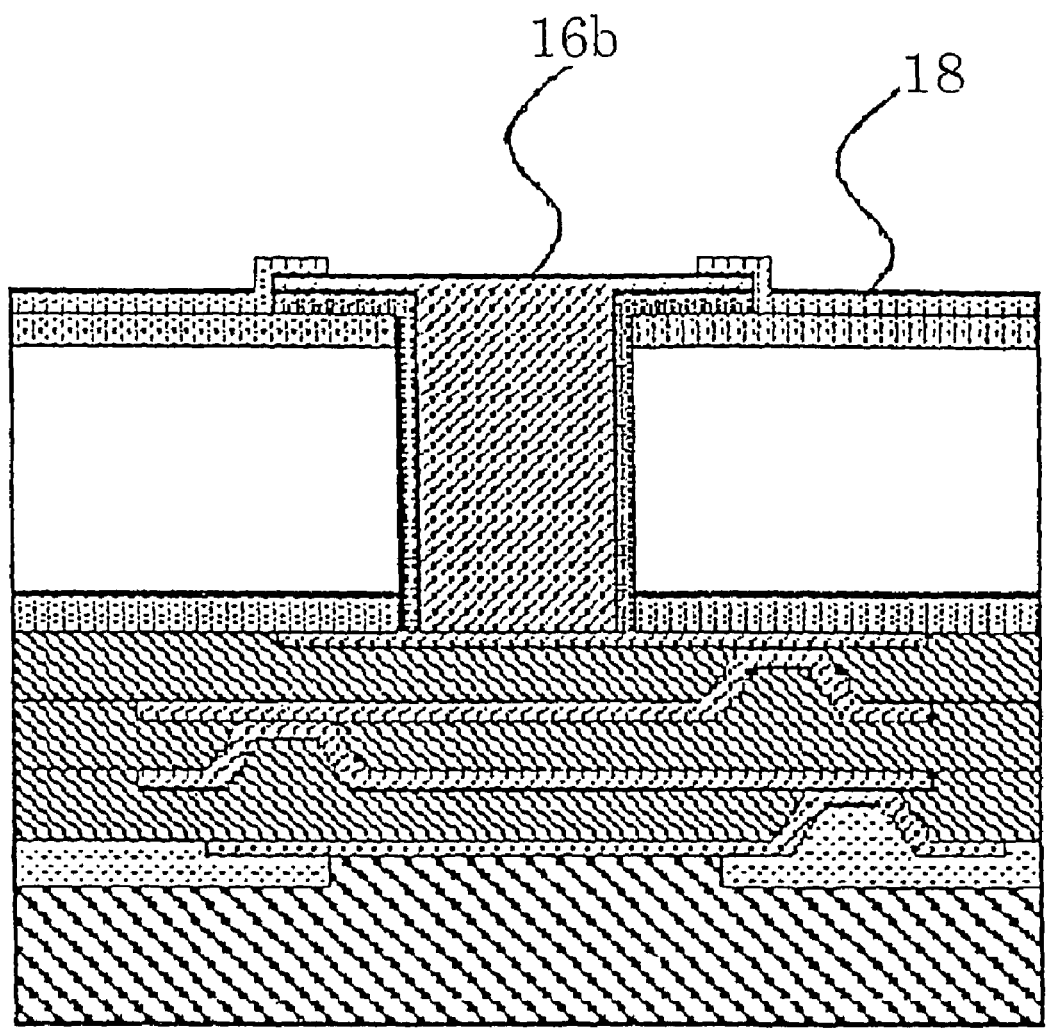

5D, electrode 16*b* is formed, and as shown in FIG. 5E, SiN cover film 18 is formed. Accordingly, a wafer shaped wiring substrate 2 is completed.

Fourth Embodiment

Figure 6:
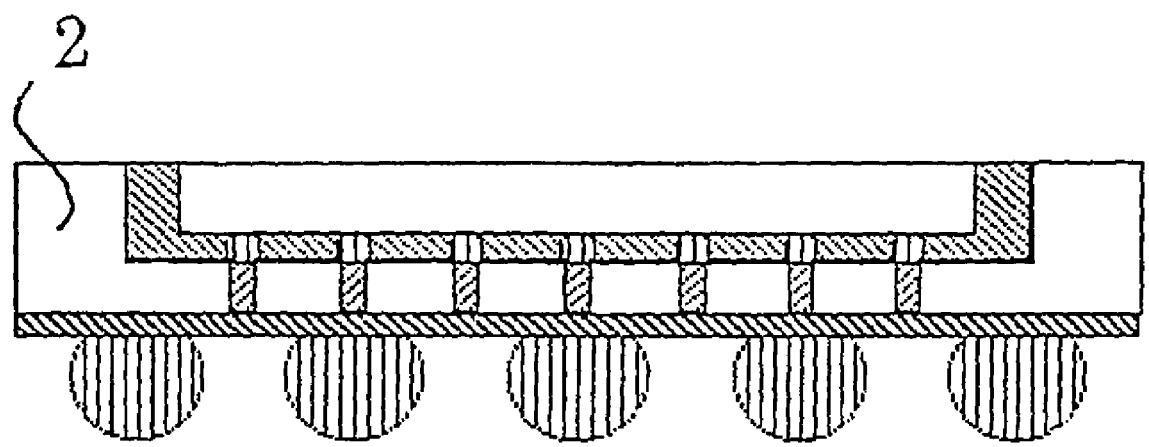
FIG. 6 is a cross sectional view showing a structure of semiconductor apparatus in the fourth embodiment of the present invention.

FIG. 6 is a cross sectional view showing a structure of a semiconductor apparatus in a fourth embodiment of the present invention. FIGS. 7A to 7D are cross sectional views of a semiconductor apparatus at an assembly process after Flip-Chip bonding process of the semiconductor apparatus in the fourth embodiment of the present invention.

In the fourth embodiment, according to FIG. 6, a central area is thinned by forming a step around base substrate 3. The back side of base substrate 3 is ground after mounting and molding semiconductor chip 1 with mold compound to achieve a thin semiconductor apparatus in total.

Figure 7A:
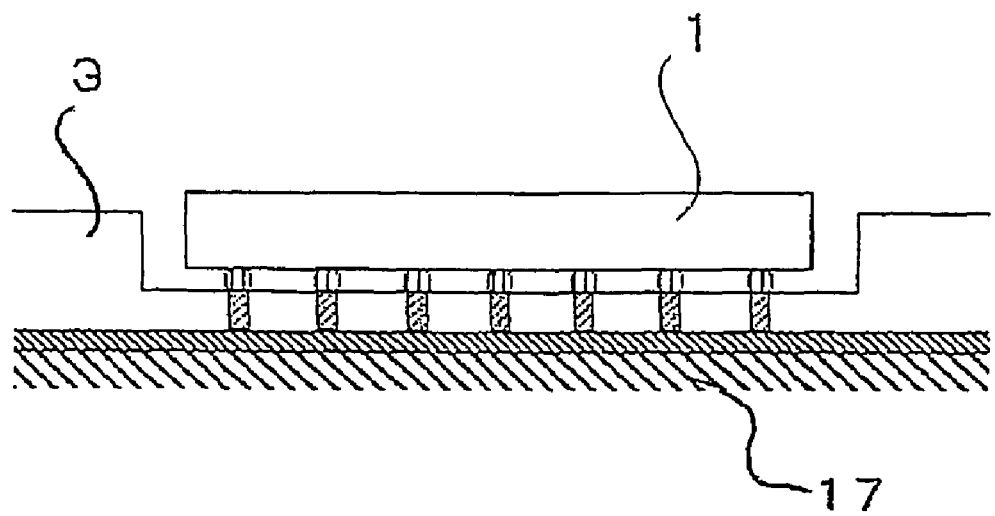
FIG. 7A to 7D are cross sectional views of a semiconductor apparatus at each assembly process after Flip-Chip bonding process of the semiconductor apparatus in the fourth embodiment of the present invention.
Figure 7B:
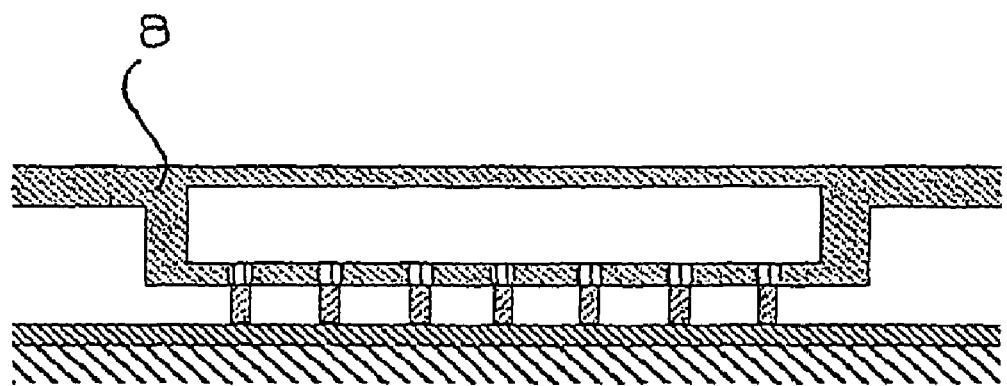

First, as shown in FIG. 7A, semiconductor chip 1 is bonded with Flip-Chip bonding to a wafer shaped wiring substrate 2, to which support 17 is stuck. Then, as shown FIG. 7B, mold compound 8 is filled in a space between semiconductor 1 and base substrate 3. Mold compound 8 is supplied until the surface of the molded substance is covered with mold compound 8. This is implemented for the purpose of decreasing an effect of damage caused by grinding of the backside of semiconductor chip 1. It is possible to neglect the process, or to change a supply quantity of mold compound 8 arbitrarily if it does not effect on the bonding portion and the apparatus reliability.

Figure 7C:
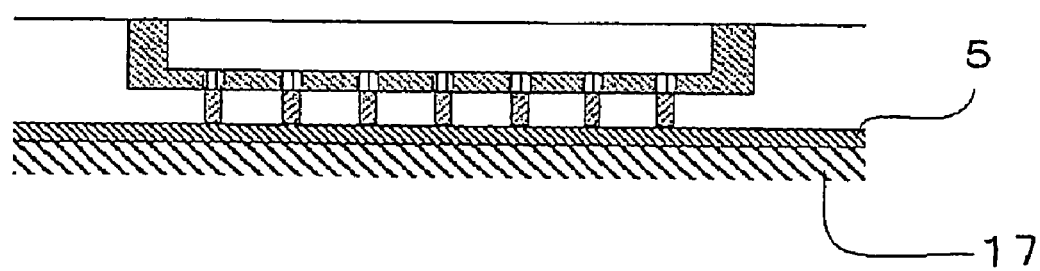
Figure 7D:
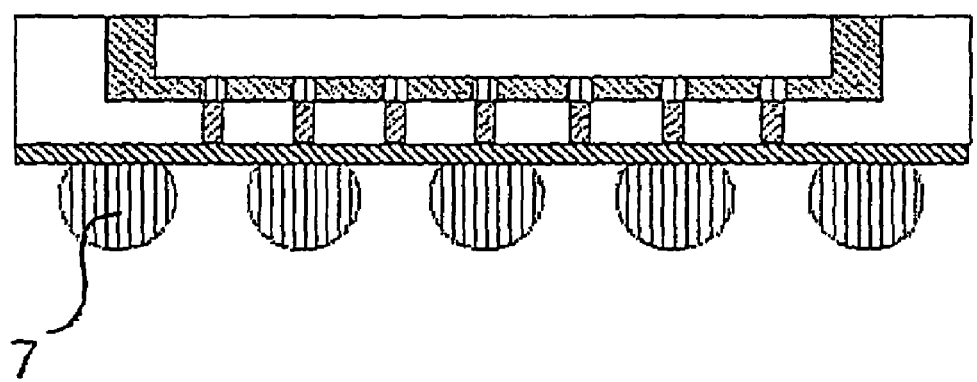

After that, as shown in FIG. 7C, the backside of semiconductor chip 1 is ground until the thickness becomes about 50 µm. The thickness of the semiconductor apparatus except an external bonding bump is set at about 220 µm. Meanwhile, wiring layer 5 is consist of two layers. Next, as shown in FIG. 7D, the wafer is diced into chips, and support 17 is peeled off. Finally, the external bonding bump is formed with a micro ball mounting method to complete the semiconductor apparatus. For example, a solder paste printing method, an evaporation method, an electrolytic plating and others may be used for forming the external bonding bump. The order of peeling off of the support and the dicing process is arbitrarily changed considering the bump formation method and production efficiency.

Fifth Embodiment

In the first embodiment, after forming a through-electrode on the base substrate of silicon, a wiring layer is formed and bonded to a support. Then, the silicon is thinned to expose a mounting surface of semiconductor chip 1 to form wiring substrate 2. In the third embodiment, wiring layer 5 is formed on the silicon substrate, and the silicon is thinned from the backside of it. After that, by forming a through-electrode, a mounting surface of semiconductor chip 1 is formed to form wiring substrate 2.

In either case, the mounting surface of semiconductor chip 1 is formed at a final process. In a fifth embodiment, a via, which is a though-hole, is formed on base substrate 2 with RIE, followed by formation of an insulating film on the inner wall, filling of a conductor, and planarization with CMP to form a pad for mounting semiconductor chip 1. Then, the pad surface is bonded to a support, followed by arbitrary combination of grinding and RIE to thin the silicon to form a through-electrode. After that, a multi wiring layer and an external terminal are formed to form a wiring substrate. According to this method, a diffusion process technology of semiconductor manufacturing can be applied to, for example, an electrode formation process on a mounting surface of semiconductor chip 1 and a functional element formation process such as a capacitor, which are both required substantially high accuracy, before forming the support and multi wiring layer.

In these embodiments, a diameter of the via is set at 80 µm. However, a diameter of 150 µm at boring process for forming the via is acceptable. Even though depending on an alignment pitch of electrodes, a smaller via is favorable from high density point of view. Then, a diameter less than 50 µm is employed. A diameter of 10 µm is achievable by selecting a via formation method.

In the process for exposing a via, when the silicon and the conductor filled in the via are processed together with mechanical grounding, the grinding stone is likely to be clogged with the conductor, thereby resulting in rough surface. As a result, the process yield may be decreased. Therefore, it is favorable that a percentage of a via surface within the silicon surface, where is to be ground, is less than 2%. Because of this reason, when extraction of 60 substrates with 4000 pins from 8 inch wafer is layouted, a diameter less than 30 µm is the most suitable for the through-via. However, considering a filling efficiency of the conductive material in the via from filling process point of view, a diameter more than 10 µm is favorable.

As explained in the above, according to the present embodiment, since semiconductor chip 1 is bonded to base substrate 3 of wiring substrate 2 which has a thermal expansion coefficient close to that of semiconductor chip 1, an internal stress caused by mismatch of the thermal expansion coefficient between them is substantially decreased. In addition, a change of internal stress caused by mounting a semiconductor apparatus on a motherboard and by temperature change under operating circumstances is also decreased, thereby resulting in increase in reliability. Accordingly, it becomes possible to overcome a decrease of allowance level of the internal stress due to, for instance, growing in size of semiconductor chip 1 according to increase of the number of external terminal, application of fragile Low-k film to an interlayer dielectric film, and decrease of stress relaxation ability by using an environmentally-friendly Lead-free solder.

In addition, according to the present embodiment, since wiring layer 5 of wiring substrate 2 is formed on a rigid base substrate 3, it is suitable to form a fine wiring pattern, and most of the manufacturing processes of the semiconductor apparatus can be processed with a wafer. As a result, a high production efficiency and a low cost manufacturing are both can be achieved.

Further, according to the present embodiment, a stress is caused by the difference of thermal expansion coefficient between the base substrate and a resin material used for the interlayer dielectric film substantially occupying wiring layer 5, which is formed at backside of the chip mounting surface of wiring substrate 2. However, by sticking a reinforcing frame partially or entirely to the outer part of a mounting position of semiconductor chip 1 at the chip mounting surface, the rigidity of base substrate 3 is maintained even if the thickness of base substrate 3 at the mounting position of semiconductor chip 1 is substantially thinned. Accordingly, it is possible to increase a mountability and a reliability by suppressing warpage of wiring substrate 2.

Moreover, according to the present embodiment, a stress is caused by the difference of thermal expansion coefficient between base substrate 3 and a resin material used for the interlayer dielectric film substantially occupying wiring layer 5, which is formed at backside of a chip mounting surface of wiring substrate 2. However, by increasing the thickness partially or entirely of the outer part of the mounting position of semiconductor chip 1 at the chip mounting surface, the rigidity of base substrate 3 is maintained even if the thickness of base substrate 3 at the mounting position of semiconductor chip 1 is substantially thinned. As a result, it is possible to increase the mountability and the reliability by suppressing warpage of wiring substrate 2, as well as increasing simplicity of the process by simultaneously forming a surrounding step when base substrate 3 is thinned. Accordingly, the cost can be down.

In addition, according to the present embodiment, by disposing, for example, a capacitor, a resistor, and a inductor on the surface of base substrate 3 for forming a wiring layer, or in wiring layer 5, an optimum arrangement of functional elements, for example, the capacitor, the resistor and the inductor is achieved at optimum position in wiring substrate 5 for each element. As a result, improvements of high frequency characteristics and high functionality can be achieved. Moreover, shrinkage of mounting area and increase of design freedom can be realized.

Furthermore, according to the present embodiment, by stacking wiring layer 5 on base substrate 3 which has a small thermal expansion coefficient and high rigidity, it becomes possible to form a fine wiring pattern compared with the case where wiring layer 5 is stacked on a resin-based base material.

It is obvious that the present invention is not limited to each embodiment, and the each embodiment may be changed within a technological scope and sprit of the present invention. In addition, the number of components, positions, features, and the like are not limited to the embodiment, and they may be determined based on a practical application of the present invention.

The identical elements at each figure are given the same symbols.

POSSIBILITY FOR INDUSTRIAL APPLICATION

A semiconductor apparatus, a wiring substrate for the semiconductor apparatus, and a method for manufacturing the wiring substrate according to the present invention are applicable to all semiconductor apparatuses and not limited the possibility of application, if the semiconductor apparatus is such that a semiconductor chip is mounted on a wiring substrate with Flip-Chip method.

While the present invention has been described by associating with some preferred embodiments and examples, it is to be understood that these embodiments and examples are merely for illustrative of the invention by an example, and not restrictive. While it will be obvious to those skilled in the art that various changes and substitutions by equivalent components and techniques are eased upon reading the specification, it is believed obvious that such changes and substitutions fit into the true scope and spirit

What is claimed is:

1. A semiconductor apparatus in which a semiconductor chip is mounted on a wiring substrate with Flip-Chip,
wherein the wiring substrate comprises:
a monolithic base substrate formed from any one of a silicon, a ceramic, or a photosensitive glass;
a wiring layer having an insulating layer and a wiring formed on a wiring layer formation surface which is one surface of the monolithic base substrate;
an electrode formed on a chip mounting surface which is a backside of the wiring layer formation surface of the monolithic base substrate; and
a through-electrode formed on the monolithic base substrate electrically connecting the wiring layer formed on the wiring layer formation surface and the electrode formed on the chip mounting surface,
wherein a thermal expansion coefficient of the monolithic base substrate is equal to a thermal expansion coefficient of the semiconductor chip, and the thermal expansion coefficient of the monolithic base substrate is less than a thermal expansion coefficient of the wiring layer,
wherein the semiconductor chip is bonded to the chip mounting surface with face-down.

2. The semiconductor apparatus according to claim 1, wherein a reinforcing frame is stuck at least on a part of an outer part of a chip mounting position of the chip mounting surface.

3. The semiconductor apparatus according to claim 2, wherein a thermal expansion coefficient of the reinforcing frame is equal to the thermal expansion coefficient of the semiconductor chip, or less than the thermal expansion coefficient of the wiring layer.

4. The semiconductor apparatus according to claim 1, wherein a thickness of the monolithic base substrate, at least a part of an outer part of a semiconductor chip mounting position at the chip mounting surface, is thicker than the semiconductor chip mounting position at the chip mounting surface.

5. The semiconductor apparatus according to claim 1, wherein a functional element is formed on at least any one of the wiring layer formation surface or the wiring layer.

6. The semiconductor apparatus according to claim 1, wherein the thermal expansion coefficient of the semiconductor chip is smaller than a thermal expansion coefficient of the wiring layer.

7. A wiring substrate which mounts a semiconductor chip with Flip-Chip,
wherein the wiring substrate comprises:
a monolithic base substrate formed from any one of a silicon, a ceramic, or a photosensitive glass;
a wiring layer having an insulating layer and a wiring formed on a wiring layer formation surface which is one surface of the monolithic base substrate;
an electrode formed on a chip mounting surface which is a backside of the wiring layer formation surface of the monolithic base substrate; and
a through-electrode formed on the monolithic base substrate electrically connecting the wiring layer formed on the wiring layer formation surface and the electrode formed on the chip mounting surface,
wherein a thermal expansion coefficient of the monolithic base substrate is equal to a thermal expansion coefficient of the semiconductor chip, and the thermal expansion coefficient of the monolithic base substrate is less than a thermal expansion coefficient of the wiring layer.

8. The wiring substrate according to claim 7, wherein a reinforcing frame is stuck at least on a part of an outer part of a chip mounting position of the chip mounting surface.

9. The wiring substrate according to claim 8, wherein a thermal expansion coefficient of the reinforcing frame is equal to the thermal expansion coefficient of the semiconductor chip, or less than the thermal expansion coefficient of the wiring layer.

10. The wiring substrate according to claim 7, wherein a thickness of the monolithic base substrate, at least a part of an outer part of a semiconductor chip mounting position at the chip mounting surface, is thicker than the semiconductor chip mounting position at the chip mounting surface.

11. The wiring substrate according to claim 7, wherein a functional element is formed on at least any one of the wiring layer formation surface or the wiring layer.

12. The wiring substrate according to claim 7, wherein the thermal expansion coefficient of the semiconductor chip is smaller than a thermal expansion coefficient of the wiring layer.

13. A method for manufacturing a wiring substrate which comprises a monolithic base substrate formed from any one of a silicon, a ceramic, or a photosensitive glass and a wiring layer having an insulating layer and a wiring formed on a wiring layer formation surface, which is one surface of the monolithic base substrate, and mounts a semiconductor chip with Flip-Chip, and a thermal expansion coefficient of the monolithic base substrate is equal to a thermal expansion coefficient of the semiconductor chip, and the thermal expansion coefficient of the monolithic base substrate is less than a thermal expansion coefficient of the wiring layer, the method comprising steps of:
   forming a half-through-hole from the wiring layer formation surface of the monolithic base substrate;
   forming a first electrode on the wiring layer formation surface by burying the half-through-hole with an electrically conductive material;
   forming the wiring layer on the wiring layer formation surface; and
   forming a second electrode for mounting the semiconductor chip by exposing the half-through-hole through thinning the monolithic base substrate from a backside of the wiring layer formation surface.

14. The method for manufacturing a wiring substrate according to claim 13, further comprising a step of:
   thinning the monolithic base substrate by maintaining a step between at least one part of an outer part of a semiconductor chip mounting position and the other part of the semiconductor chip mounting position, by making a work amount smaller at least at the one part of the outer part of the semiconductor chip mounting position than the other part of the semiconductor chip mounting position.

15. The method for manufacturing a wiring substrate according to claim 13, further comprising a step of:
   forming a functional element during forming the wiring layer.

16. A method for manufacturing a wiring substrate which comprises a monolithic base substrate formed from any one of a silicon, a ceramic, or a photosensitive glass and a wiring layer formed on a wiring layer formation surface, which is one surface of the monolithic base substrate, and mounts a semiconductor chip with Flip-Chip, and a thermal expansion coefficient of the monolithic base substrate is equal to a thermal expansion coefficient of the semiconductor chip, and the thermal expansion coefficient of the monolithic base substrate is less than a thermal expansion coefficient of the wiring layer, the method comprising steps of:
   forming the wiring layer on the wiring layer formation surface of the monolithic base substrate;
   forming a through-hole which penetrates only the monolithic base substrate from a backside of the wiring layer formation surface of the monolithic base substrate; and
   forming an electrode for mounting the semiconductor chip at the backside of the wiring layer formation surface by burying the through-hole with an electrically conductive material.

17. The method for manufacturing a wiring substrate according to claim 16, further comprising a step of:
   thinning the monolithic base substrate by maintaining a step between at least one part of an outer part of a semiconductor chip mounting position and an other part of the semiconductor chip mounting position, by making a work amount smaller at least at the one part of the outer part of the semiconductor chip mounting position than the other part of the semiconductor chip mounting position.

18. The method for manufacturing a wiring substrate according to claim 16, further comprising a step of:
   forming a functional element during forming the wiring layer.

* * * * *